(12) United States Patent
Chang et al.

(10) Patent No.: US 10,097,214 B2
(45) Date of Patent: Oct. 9, 2018

(54) ERROR CORRECTING METHOD

(71) Applicant: Metal Industries Research & Development Centre, Kaohsiung (TW)

(72) Inventors: Chih-Ming Chang, Kaohsiung (TW);
Kuang-Shine Yang, Tainan (TW);
Ho-Chung Fu, Kaohsiung (TW);
Ying-Cherng Lu, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 0 days.

(21) Appl. No.: 14/953,422

(22) Filed: Nov. 30, 2015

(65) Prior Publication Data

US 2017/0155410 A1 Jun. 1, 2017

(51) Int. Cl.
*H03M 13/00* (2006.01)
*H03M 13/47* (2006.01)
*H03M 13/15* (2006.01)
*G06F 17/13* (2006.01)

(52) U.S. Cl.
CPC ....... *H03M 13/47* (2013.01); *H03M 13/1585* (2013.01); *G06F 17/13* (2013.01)

(58) Field of Classification Search
CPC .... H03M 13/47; H03M 13/1585; G06F 17/13
USPC ........................ 714/752, 758, 774
See application file for complete search history.

(56) References Cited

U.S. PATENT DOCUMENTS 5,371,669 A * 12/1994 Venkataraman ..... G05B 13/047
700/261

6,801,881 B1 * 10/2004 Shah ...................... G05B 17/02
700/105
8,266,085 B1 * 9/2012 Meyers ................ G06N 3/0635
706/45
2001/0019088 A1 * 9/2001 Smith ..................... B64C 33/02
244/17.13
2003/0125818 A1 * 7/2003 Johnson ............... G05B 13/042
700/28
2004/0107231 A1 * 6/2004 Koyanagi ............... G06F 17/17
708/290
2005/0123079 A1 * 6/2005 Yamamoto ............ H03J 1/0066
375/344
2005/0124310 A1 * 6/2005 Yamamoto ........... H04B 1/1081
455/296
2007/0028219 A1 * 2/2007 Miller .................. G05B 23/021
717/124

(Continued)

FOREIGN PATENT DOCUMENTS

| TW | 573293 | 1/2004 | |
|---|---|---|---|
| TW | 1290633 | 12/2007 | |
| TW | 1463284 | * 12/2014 | ............. G05B 19/40 |

*Primary Examiner* — Albert Decady
*Assistant Examiner* — Osman M Alshack
(74) *Attorney, Agent, or Firm* — JCIPRNET

(57) ABSTRACT

An error correcting method is provided, which includes the following steps. An error value is obtained. The error value is substituted into an error correcting function, so that the error correcting function causes the error value to converge to 0 in a finite time. The error correcting function conforms to a non-Lipschitzian characteristic. An embodiment of the disclosure solves the problem in traditional system stability analysis through a differential equation, adjusts parameters to determine a convergence time, and ensures that a convergence target fully conforms to an expected value and that a unique solution of the error value is 0.

10 Claims, 4 Drawing Sheets

(56) References Cited

U.S. PATENT DOCUMENTS

2010/0042266 A1* 2/2010 Barhen ................ C10M 171/00
                                                              700/304

* cited by examiner

ERROR CORRECTING METHOD

BACKGROUND OF THE DISCLOSURE

[Field of the Disclosure]

The disclosure relates to an error correcting method and particularly relates to an error correcting method based on a non-Lipschitzian characteristic.

[Description of Related Art]

With the rapid development of technology, the costs for development of drones (also called unmanned aircraft system (UAS) or unmanned aerial vehicle (UAV)) that were originally used for military purposes are dropping, which urges major electronics companies to lay more focus on this field. Now several electronics companies are trying to apply drones to various fields, such as delivery of goods/food and sports photography. The market of drones is expected to bring a lot of job opportunities and create a tremendous economic value.

On the other hand, error correction is a very important technical issue in the design of the flight controller for drones or other sophisticated controlled systems. However, the traditional system stability analysis has come to a bottleneck (for example, the system can only converge to a certain range). Therefore, new technology is needed in order to achieve a breakthrough.

SUMMARY OF THE DISCLOSURE

The disclosure provides an error correcting method, which converges an error value to 0 in a finite time, so as to achieve a breakthrough in traditional system stability analysis.

The disclosure provides an error correcting method, which is adapted for a controlled system, and includes the following steps. An error value is obtained from the detector of the controlled system. The error value is substituted into an error correcting function, such that the controlled system based on the error correcting function causes the error value to converge to 0 in a finite time. The error correcting function conforms to a non-Lipschitzian characteristic.

In an embodiment of the disclosure, the non-Lipschitzian characteristic indicates that a convergence value of a function is only 0, and the convergence value does not vary after converging to 0.

In an embodiment of the disclosure, the error correcting function is $\dot{x}_1 = -|x_1|^{1/n}\mathrm{sgn}(x_1)$, wherein $x_1$ is the error value and n is a hierarchy.

In an embodiment of the disclosure, the error correcting function is $\dot{x}_2 = -\sin h(|x_2|^{1/n}\mathrm{sgn}(x_2))$, wherein $x_2$ is the error value and n is a hierarchy.

In an embodiment of the disclosure, further comprising the following step. Determining the finite time according to a convergence time function. The convergence time function is $$x(t) = \begin{cases} (|C|^{1-1/n} - (1-1/n)t)^{\frac{1}{1-1/n}}\mathrm{sgn}(C), & 0 \le t \le \frac{|C|^{1-1/n}}{(1-1/n)} \\ 0, & t > \frac{|C|^{1-1/n}}{(1-1/n)} \end{cases},$$

wherein C is a constant value and t is a time.

In an embodiment of the disclosure, after obtaining the error value, the error correcting method further includes the following step: adjusting n to determine the finite time and the error correcting function.

In an embodiment of the disclosure, C is an initial value of the error correcting function.

In an embodiment of the disclosure, the error value is a difference between a to-be-adjusted value and a target value, and after the error value is substituted into the error correcting function, the error correcting method further includes the following step: adjusting the to-be-adjusted value according to the error correcting function, such that the to-be-adjusted value is equal to the target value in the finite time.

In an embodiment of the disclosure, the step of obtaining the error value includes the following step: converting the error value into a first-order form.

In an embodiment of the disclosure, the error value includes one of a gravity error, a temperature error, an angle error, a magnetic force error, and a distance error.

Based on the above, the error correcting method disclosed in the embodiments of the disclosure determines the error correcting function based on the non-Lipschitzian characteristic, such that the error value converges to 0 in the finite time. Further, according to the embodiments of the disclosure, the finite time is determined, so as to adjust the error correcting function. Accordingly, the embodiments of the disclosure ensure that the system convergence target fully confomis to the expected value, thereby achieving a breakthrough in traditional system stability analysis.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

From conditions of the traditional differential equation stability analysis, it is known that an exponential solution will converge. An error correcting method provided in an embodiment of the disclosure is to make the solution converge quickly through a specific differential equation and ensure reliability verification of the convergence time and convergence value. Moreover, the stability of the system is determined and proved through stability analysis. Several embodiments in accordance with the spirit of the disclosure are provided below. It should be noted that these embodiments may be adjusted/modified properly as required and are not finite to the disclosure hereinafter.

Figure 1:
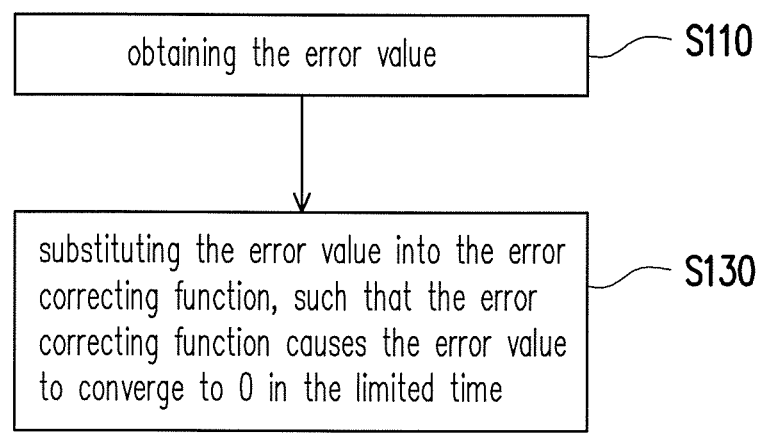
FIG. 1 is a flowchart showing the error correcting method according to an embodiment of the disclosure.

FIG. 1 is a flowchart showing an error correcting method according to an embodiment of the disclosure. Please refer to FIG. 1. The error correcting method may be adapted for a controlled system such as a robot, a vehicle, or a machine controller, etc. The controlled system may comprises at least but not only a processor for executing the proposed error correcting method, a memory module for storing a error value, a to-be-adjusted value and a target value, a detector for obtaining a. sensing value. It should be noted that the embodiments of the disclosure are not intended to limit the fields/forms the error correcting method is applied (which may include spatial information, military use, coast guard, environmental monitoring, scientific application, traffic control, and so on, for example). Steps of the method may be adjusted according to the situation of implementation and thus are not finite to the disclosure hereinafter.

In Step S110, an error value is obtained. Specifically, a sensing value or motion sensing data may be obtained by the detector of the controlled system in an application scenario, and the obtained sensing value or data is used as a to-be-adjusted value. Then, a difference between the to-be-adjusted value and a target value is calculated by the processor of the controlled system to obtain the error value. The target value may be stored in advance in the memory module of the controlled system or set by receiving an input operation of the user, but not finite to the foregoing. The error value is one of a gravity error, a temperature error, an angle error, a magnetic force error, a distance error, and so on, depending on the application scenario of the embodiment of the disclosure.

In Step S130, the error value is substituted into an error correcting function by the processor, such that the controlled system based on the error correcting function causes the error value to converge to 0 in a finite time. The error correcting function conforms to a non-Lipschitzian characteristic. The non-Lipschitzian characteristic indicates that a convergence value of the function is 0 only, and the convergence value does not vary once it converges to 0.

Specifically, the rules of a non-Lipschitzian autonomous system have the following theorem. Considering that the autonomous system $\dot{x}=f(x)$, where $f:D \to R^n$ is non-Lipschitzian continuous on an origin open neighborhood $D \subseteq R^n$ of the origin in $R^n$. The origin of $\dot{x}=f(x)$ is a finite time convergence if there exists an origin $N \subseteq D$ of the origin and a function $T_x:N\setminus\{0\} \to (0,\infty)$ calls a setting time function such that every solution a trajectory $x(t,x_0)$ of $\dot{x}=f(x)$ starting from a initial point $x_0 \in [0,T_x(x_0))$, and $$\lim_{t \to T_x(x_0)} x(t, x_0) = 0,.$$

In other words, a condition of a differential equation being differentiable is that it is continuous and smooth. If the unique solution to the differential equation is 0 and continuous but not smooth, it is undifferentiable. However, if the solution to the differential equation does not vary after reaching 0, it indicates that the differential equation converges to 0.

It may be represented by the equation (1) under the traditional differential equation design architecture:

$$\dot{x}_1 = f(x_1) = -x_1 \tag{1}$$

wherein $f(0)=0, x \in R_f$ is a locally Lipschitz continuous function. Using a Lyapunov function and defining $V=\frac{1}{2}x^2$ may ensure a convergence condition that the system is asymptotically stable but not finite time convergence stability.

The solution to the equation (1) is $x_1(t)=e^{-t}$. This solution explains that when time approaches infinity, x(t) approaches 0 but is not equal to 0. In order to ensure that the system converges to 0 in a finite time, the equation (2) is generated:

$$\dot{x}_2 = -|x_2|^{1/n} \text{sgn}(x_2) \tag{2}$$

wherein the error value may substitute for $x_2$, and n is a hierarchy (integer) (e.g. 2, 3, 5, and so on).

The convergence time function (3) of finite time may be derived from the equation (2):

$$x_2(t) = \begin{cases} (|C|^{1-1/n} - (1-1/n)t)^{\frac{1}{1-1/n}} \text{sgn}(C), & 0 \le t \le \frac{|C|^{1-1/n}}{(1-1/n)} \\ 0, & t > \frac{|C|^{1-1/n}}{(1-1/n)} \end{cases} \tag{3}$$

wherein C is a constant value ($x_2(0)=C \in R$; i.e. the error correcting function (e.g. an initial value of the equation (2))), and t is time (e.g. 1, 2, 3 seconds, and so on).

It is derived from the equation (3) that when the time is greater than a specified time $$\left(\frac{|C|^{1-1/n}}{(1-1/n)}\right)$$

(i.e., the finite time upon the equation (2) is converged to 0), the solution of the system is indeed 0. Accordingly, the equation (2) improves the problem of the traditional stability analysis and achieves a more accurate analysis architecture.

Next, in order to improve a convergence rate, the equation (4) is generated:

$$\dot{x}_3 = -\sin h(|x_3|^{1/n} \text{sgn}(x_3)) \tag{4}$$

wherein the error value may substitute for $x_3$, and n is the hierarchy (integer) (e.g. 2, 3, 5, and so on). The finite time for which the equation (4) converges to 0 is smaller than that of the equation (2) (i.e. smaller than $$\frac{|C|^{1-1/n}}{(1-1/n)}$$

shown in the equation (3)). Accordingly, in addition to the advantage of obtaining the exponential convergence, the basic condition of the solution being 0 is also obtained.

Figure 2A:
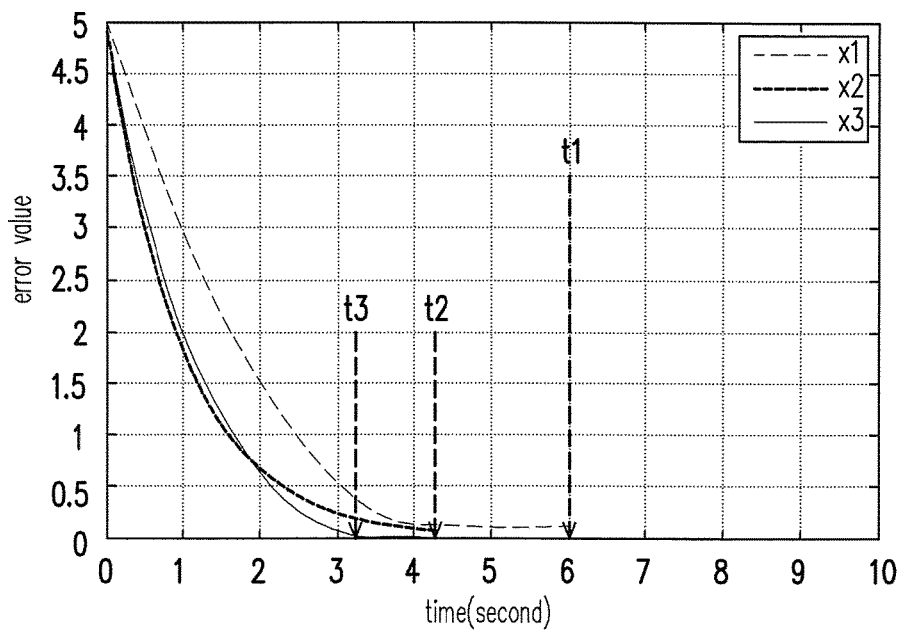
FIG. 2A and FIG. 2B are diagrams showing time-error value curves of the equations.
Figure 2B:
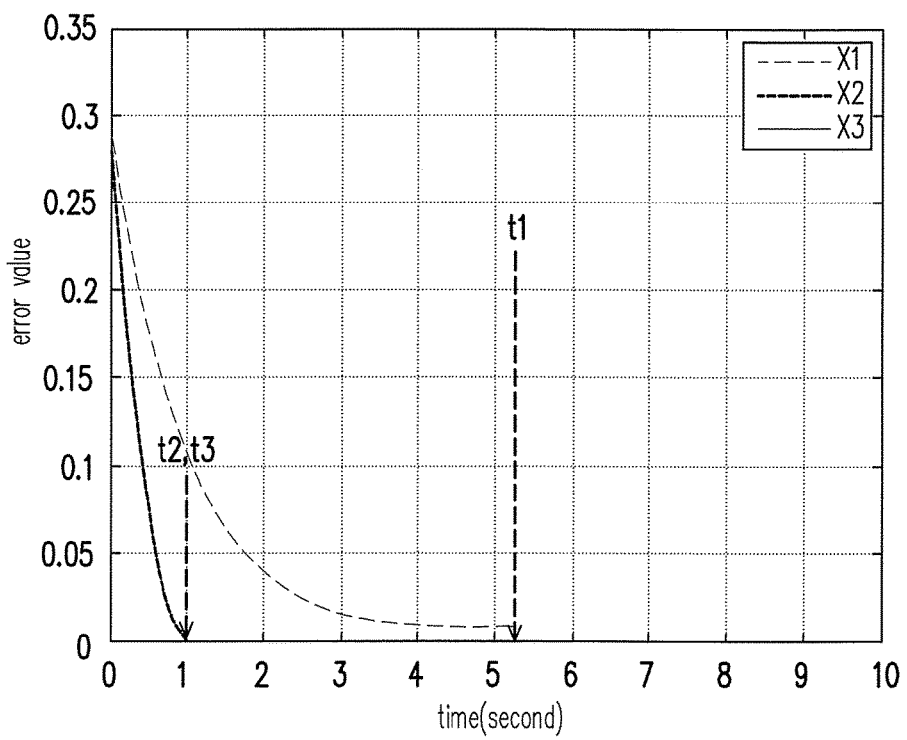

FIG. 2A and FIG. 2B are diagrams showing time-error value curves of the equations. First, with reference to FIG. 2A, $x_1$, $x_2$, and $x_3$ are curves respectively corresponding to the equations (1), (2), and (4). The equations (2) and (4) converge to 0 at a time $t_2$ and a time $t_3$ respectively while the equation (1) has not converged to 0 at a time $t_1$. Moreover, although the equation (2) has a larger drop in error value than the equation (4) in the initial period (e.g. 0-1.5 seconds), the error value of the equation (4) drops more significantly afterward. Thus, the equation (4) converges to 0 before the time $t_2$ (i.e. the time $t_3$, and the time $t_3$ is smaller than the time $t_2$).

Next, with reference to FIG. 2B, after adjusting the range of the error value (to 0-0.35), it is observed that the equations (2) and (4) have better convergence characteristics (i.e. converge to 0 more quickly) than the equation (1).

In addition, the stability of the system is ensured through the following stability analysis: considering the non-Lipschitzian differential equation. Suppose that $C^1$ function V(e) defined on a neighborhood $\hat{U} \subseteq R^n$ of the origin, and real number c>0 and $\alpha \in ]0,1[$. If the origin is a finite time is stable equilibrium of the system and the setting function T is continuous at 0, there exists the equations (5) and (6):

$$V(e_1) \text{ is positive define} \tag{5}$$

$$\dot{V}(e_1) + cV(e_1)^\alpha \le 0 \tag{6}$$

Figure 3:
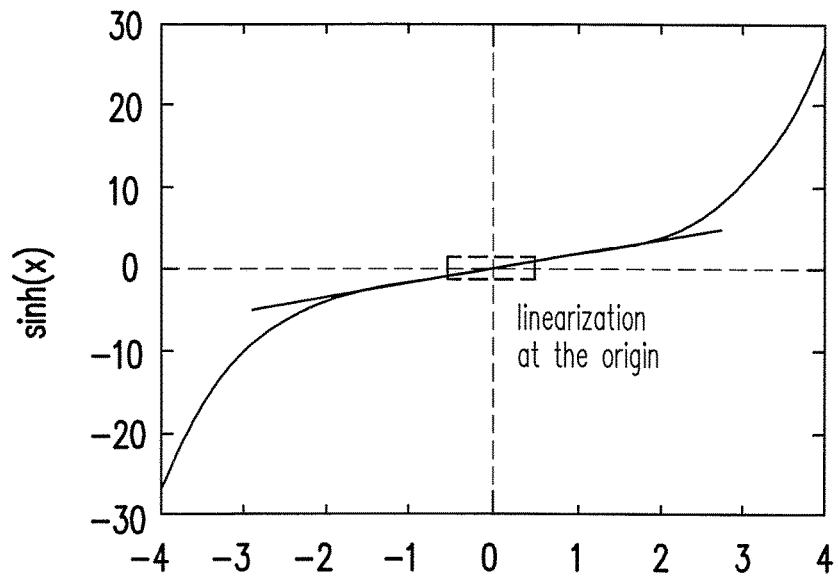
FIG. 3 is a diagram of sin h(x).

FIG. 3 is a curve diagram of sin h(x). With reference to FIG. 3, based on the equation (7):

$$\sinh(\Delta x) \approx \sinh(0) + \frac{d\sin(x)}{dx}\Big|_{x=0}\Delta x \quad (7)$$

wherein, suppose that Δx is far smaller than 1, it is supposed that the sin h(x) function has a linearization characteristic at the origin.

Figure 4:
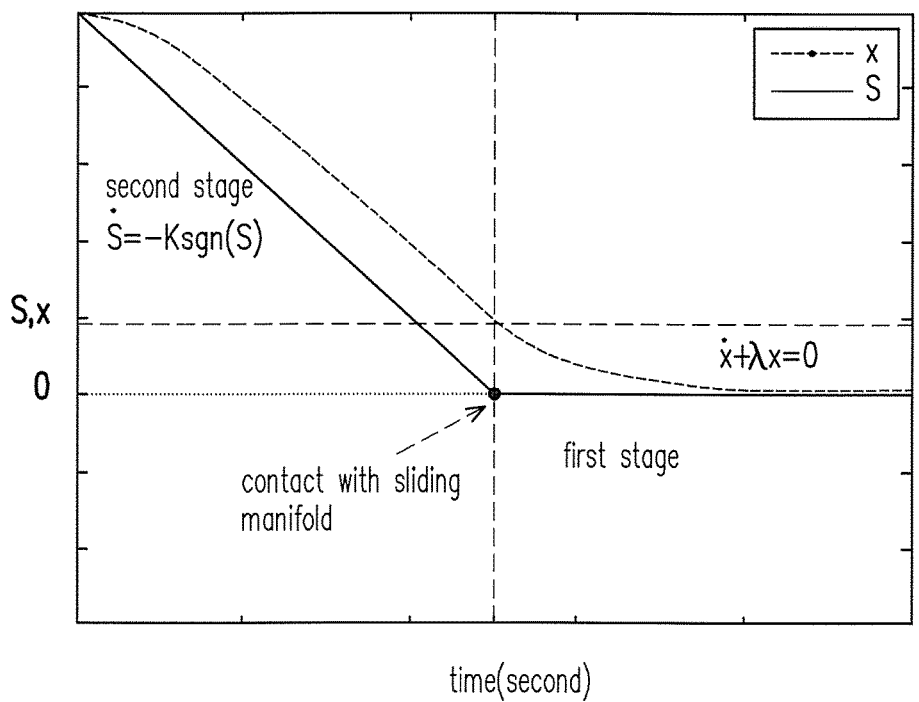
FIG. 4 is a comparison diagram.
Figure 5:
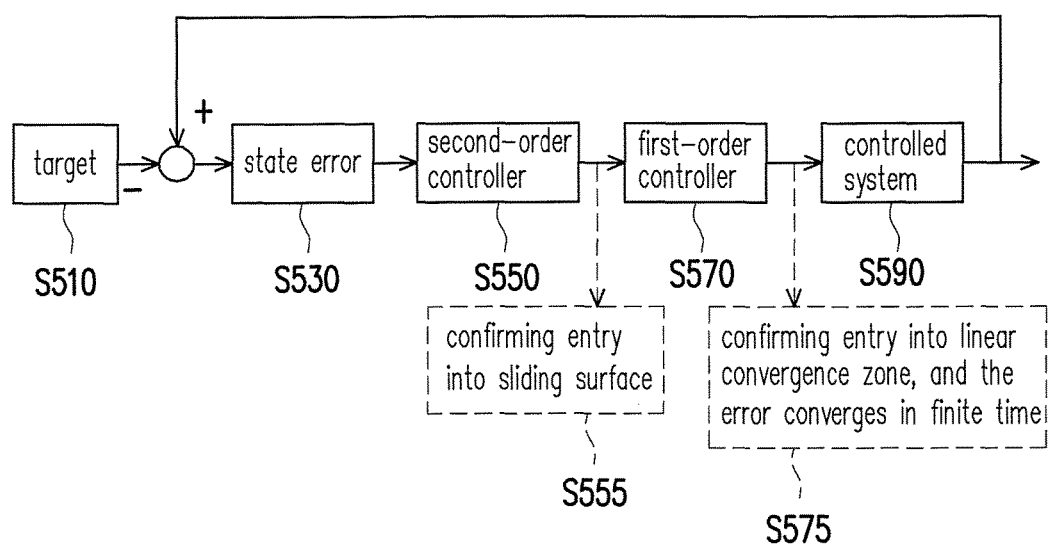
FIG. 5 shows an example of the error correcting process.

FIG. 4 is a comparison diagram. With reference to FIG. 4, the ẋ+λx=0 function (i.e. ẋ=−λx; λ is a real number) that has an exponential solution is a curve approaching 0 but not equal to 0. Next, with reference to FIG. 4 and FIG. 5, FIG. 5 shows an example of the error correcting process. In Step S510, a target value is obtained from the detector. Then, a difference between the target value and the to-be-adjusted value is calculated by the processor, so as to generate a state error value (Step S530). Provided that the state error value is a second-order form (e.g. a second-order form of displacement is acceleration), a control strategy of the Ṡ=−K sgn(S) (K is a real number) function in the second stage is to conform to an achievable condition (Step S550). In S555, the process is entered into a sliding surface is confirmed. Next, after being converted into a first-order form, it enters a first-order controller (Step S570) and is in contact with a sliding manifold in a specific time (i.e. converge to 0). In Step S575, it is an effective sliding manifold in the first stage (i.e. does not vary after converging to 0), so as to confirm entry into a linear convergence zone and that the error value converges in the finite time. Thereafter, a controlled system corrects the to-be-adjusted value based on the error correcting function (Step S590) and recursively repeats Steps S530-S590 before it converges to 0.

In actual application, the processor adjusts the hierarchy n so as to determine the finite time and the error correcting function (i.e. the equations (2) and (4)). In other words, those who implement the embodiments of the disclosure may set the finite time (i.e. the time the error value converges to 0), so as to determine the hierarchy n and thereby determine the error correcting function.

In an embodiment, after the error correcting function is determined, the to-be-adjusted value may be adjusted by the processor according to the error correcting function, such that the to-be-adjusted value is equal to the target value in the finite time. For example, the to-be-adjusted value inputted as the controlled parameter of a temperature sensor would be modified. In other words, if the difference (i.e. the error value) between the to-be-adjusted value and the target value conforms to the error correcting function (i.e. the equations (2) and (4)), it is ensured that the to-be-adjusted value conforms to the target value in the finite time.

To conclude, the error correcting method disclosed in the embodiments of the disclosure determines the error correcting function (i.e. ẋ$_1$=−|x$_1$|$^{1/n}$sgn(x$_1$) and ẋ$_2$=−sin h(|x$_2$|$^{1/n}$sgn(x$_2$)) based on the non-Lipschitzian characteristic, so as to achieve a breakthrough in the traditional system stability analysis through the differential equation. The embodiments of the disclosure achieve the required convergence time (i.e. the finite time) through adjustment to the parameters (e.g. adjusting n) and ensure that the convergence target fully conforms to the expected value and that the only solution of the error value is 0. In comparison with the traditional stability analysis that can only ensure the system to converge in a certain range, the embodiments of the disclosure further enhance the system stability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An error correcting method, adapted for an unmanned aerial vehicle having a second-order controller, a first order controller, a memory and a detector, comprising:
    obtaining a motion sensing data of the unmanned aerial vehicle from the detector;
    obtaining an error value from the detector, wherein the error value is a difference between the motion sensing data and a target value, and the error value comprises one of a gravity error, a temperature error, an angle error, a magnetic force error, a distance error; and
    substituting the error value into an error correcting function by the second-order controller and the first order controller, such that the unmanned aerial vehicle based on the error correcting function causes the error value to converge to 0 in a finite time, wherein the error correcting function conforms to a non-Lipschitzian characteristic which indicates that a convergence value of a function is only 0, and the convergence value does not vary after converging to 0, wherein the error correcting function is ẋ$_1$=−|x$_1$|$^{1/n}$sgn(x$_1$), wherein x1 is the error value and n is a hierarchy,
    wherein the second-order controller converts the error value of a second-order form into the error value of a first-order form, and the first-order controller converges the error value of the first-order form into 0 in a specific time,
    wherein the error value is a difference between a to-be-adjusted value obtained from the detector and a target value, and after the error value is substituted into the error correcting function, the error correcting method further comprises:
    adjusting the to-be-adjusted value according to the error correcting function, such that the to-be-adjusted value is equal to the target value in the finite time.

2. The error correcting method according to claim 1, further comprising:
    determining the finite time according to a convergence time function, wherein the convergence time function is $$x(t) = \begin{cases} (|C|^{1-1/n} - (1-1/n)t)^{\frac{1}{1-1/n}}\text{sgn}(C), & 0 \le t \le \frac{|C|^{1-1/n}}{(1-1/n)} \\ 0, & t > \frac{|C|^{1-1/n}}{(1-1/n)} \end{cases},$$

wherein C is a constant value and t is a time.

3. The error correcting method according to claim 2, wherein after obtaining the error value, the error correcting method further comprises:
    adjusting n to determine the finite time and the error correcting function.

4. The error correcting method according to claim 2, wherein C is an initial value of the error correcting function.

5. The error correcting method according to claim 1, wherein the step of obtaining the error value comprises:
    converting the error value into a first-order form.

6. The error correcting method according to claim 1, wherein the error value comprises one of a gravity error, a temperature error, an angle error, a magnetic force error, and a distance error.

7. An error correcting method, adapted for an unmanned aerial vehicle having a second-order controller, a first order controller, a memory and a detector, comprising:
- obtaining a motion sensing data of the unmanned aerial vehicle from the detector;
- obtaining an error value from the detector, wherein the error value is a difference between the motion sensing data and a target value, and the error value comprises one of a gravity error, a temperature error, an angle error, a magnetic force error, a distance error; and
- substituting the error value into an error correcting function by the second-order controller and the first order controller, such that the unmanned aerial vehicle based on the error correcting function causes the error value to converge to 0 in a finite time, wherein the error correcting function conforms to a non-Lipschitzian characteristic which indicates that a convergence value of a function is only 0, and the convergence value does not vary after converging to 0, wherein the error correcting function is $\dot{x}_2 = -\sin h(|x_2|^{1/n} \text{sgn}(x_2))$, wherein x2 is the error value and n is a hierarchy, wherein the second-order controller converts the error value of a second-order form into the error value of a first-order form, and the first-order controller converges the error value of the first-order form into 0 in a specific time, wherein the error value is a difference between a to-be-adjusted value obtained from the detector and a target value, and after the error value is substituted into the error correcting function, the error correcting method further comprises:
- adjusting the to-be-adjusted value according to the error correcting function, such that the to-be-adjusted value is equal to the target value in the finite time.

8. The error correcting method according to claim 7, further comprising:
- determining the finite time according to a convergence time function, wherein the convergence time function is $$x(t) = \begin{cases} (|C|^{1-1/n} - (1-1/n)t)^{\frac{1}{1-1/n}} \text{sgn}(C), & 0 \le t \le \frac{|C|^{1-1/n}}{(1-1/n)} \\ 0, & t > \frac{|C|^{1-1/n}}{(1-1/n)} \end{cases},$$

wherein C is a constant value and t is a time.

9. The error correcting method according to claim 8, wherein after obtaining the error value, the error correcting method further comprises:
- adjusting n to determine the finite time and the error correcting function.

10. The error correcting method according to claim 8, wherein C is an initial value of the error correcting function.

* * * * *